United States Patent
de Haas

(10) Patent No.: US 9,223,736 B2
(45) Date of Patent: Dec. 29, 2015

(54) DEVICES AND METHODS FOR AN ENHANCED DRIVER MODE FOR A SHARED BUS

(71) Applicant: NXP B.V., Eindhoven (NL)

(72) Inventor: Clemens Gerhardus Johannes de Haas, Ewijk (NL)

(73) Assignee: NXP B.V., Eindhoven (NL)

( * ) Notice: Subject to any disclaimer, the term of this patent is extended or adjusted under 35 U.S.C. 154(b) by 323 days.

(21) Appl. No.: 13/886,855

(22) Filed: May 3, 2013

(65) Prior Publication Data

US 2014/0330996 A1 Nov. 6, 2014

(51) Int. Cl.
| | |
|---|---|
| *G06F 13/40* | (2006.01) |
| *G06F 13/42* | (2006.01) |
| *H04L 12/40* | (2006.01) |
| H03K 19/018 | (2006.01) |
| H04L 12/64 | (2006.01) |
| H04L 25/02 | (2006.01) |
| H04L 12/935 | (2013.01) |

(52) U.S. Cl.
CPC ........ *G06F 13/4031* (2013.01); *G06F 13/4072* (2013.01); *G06F 13/4282* (2013.01); *H04L 12/40032* (2013.01); *H03K 19/01812* (2013.01); *H04L 12/40169* (2013.01); *H04L 12/6418* (2013.01); *H04L 25/0264* (2013.01); *H04L 49/30* (2013.01); *H04L 2012/40215* (2013.01); *H04L 2012/40273* (2013.01)

(58) Field of Classification Search
CPC ..... G06F 13/38; G06F 13/40; G06F 13/4063; G06F 13/4068; G06F 13/4072; G06F 13/4086; G06F 13/42; G06F 13/4282; G06F 13/4031; H03K 19/01812; H04L 12/40032; H04L 12/40169; H04L 12/6418; H04L 25/0265; H04L 2012/40215; H04L 2012/40273; H04L 49/30

See application file for complete search history.

(56) References Cited

U.S. PATENT DOCUMENTS

| | | | |
|---|---|---|---|
| 8,222,918 B1 * | 7/2012 | Tan ................................. | 326/30 |
| 2003/0048654 A1 * | 3/2003 | Schwartz et al. ............. | 365/145 |

(Continued)

FOREIGN PATENT DOCUMENTS

| | | | |
|---|---|---|---|
| DE | 10003705 A1 * | 8/2001 | |
| EP | 1 569 126 A1 | 8/2005 | |

(Continued)

OTHER PUBLICATIONS

"Can Bus Message Frames—Error Frame". Communication and Protocol Data. Online Nov. 14, 2009. Retrieved from Internet May 12, 2015. <http://rs232-rs485.blogspot.com/2009/11/can-bus-message-frames-error-frame.html>.*

(Continued)

*Primary Examiner* — Thomas J Cleary

(57) ABSTRACT

A device includes a transmission circuit that is configured and arranged to transmit data in accordance with a signal bus protocol that uses passive bias to set a signal bus to a recessive value in the absence of an actively-driven signal value. The transmission circuit includes a first driver circuit that is configured and arranged to actively drive the signal bus to a dominant value that is different from the recessive value. The transmission circuit also includes a second driver circuit that is configured and arranged to actively drive the signal bus to the recessive value. A control circuit is configured and arranged to disable the second driver circuit in response to the device operating in a first data transmission mode, and to enable the second driver circuit in response to the device entering a second transmission mode.

14 Claims, 8 Drawing Sheets

(56) References Cited

U.S. PATENT DOCUMENTS

| | | | | |
|---|---|---|---|---|
| 2003/0212481 | A1* | 11/2003 | Fuller | 701/36 |
| 2008/0059668 | A1* | 3/2008 | Charrat et al. | 710/110 |
| 2008/0164932 | A1* | 7/2008 | Welty | 327/333 |
| 2012/0159025 | A1* | 6/2012 | Tailliet | 710/110 |
| 2014/0156893 | A1* | 6/2014 | Monroe et al. | 710/117 |

FOREIGN PATENT DOCUMENTS

| | | |
|---|---|---|
| EP | 1 739 568 A1 | 1/2007 |
| EP | 2521319 A1 * | 11/2012 |

OTHER PUBLICATIONS

"Can Bus Message Frames—Error Frame". Communication and Protocol Data. Online Nov. 14, 2009. Retrieved from Internet Aug. 31, 2015. <http://rs232-rs485.blogspot.com/2009/11/can-bus-message-frames-error-frame.html>.*

Blackman, Jason, et al. "Overview of 3.3V CAN (Controller Area Network) Transceivers". Application Report SLLA337. Texas Instruments. Jan. 2013.*

CAN Specification, Version 2.0, 1991.

CAN with Flexible Data-Rate, White Paper, Version 1.1, 2011.

CAN with Flexible Data-Rate, Specification Version 1.0, Apr. 17, 2012.

Koizumi, T. et al. "Small-Amplitude Bus Drive and Signal Transmission Technology for High-Speed Memory-CPU Bus Systems", IEICE Trans. Electron., vol. E76-C, No. 11, pp. 1582-1588 (Nov. 1993).

Extended European Search Report for European Patent Appln. No. 14160290.4 (May 26, 2014).

* cited by examiner

DEVICES AND METHODS FOR AN ENHANCED DRIVER MODE FOR A SHARED BUS

Data bus standards/protocols are often designed with a particular set of applications in mind. A common consideration for a protocol is the amount of available data bandwidth. There are generally tradeoffs between increased data bandwidth and other factors (e.g., cost, ease of implementation and flexibility of system design). Accordingly, protocols can be designed to strike a balance between the amount of available data bandwidth and other considerations. Technology, however, is constantly changing and the balance of considerations can change over time. Accordingly, protocols may be modified to meet new demands. It can be desirable for a new version of a protocol to leverage off of previous hardware and/or remain backwards compatible with previous version(s). For instance, the new version may use the same physical layer, including the electrical, mechanical, and procedural interface for a transmission medium.

A particular protocol is the CAN-bus (Controller Area Network-bus) standard/protocol. This protocol was originally designed for use in vehicles, but it has applicability in many other areas, including but not limited to, aerospace, and medical equipment. The CAN standard is designed to allow microcontrollers and devices to communicate with each other using a message protocol that does not rely upon a master/host computer. The use of the CAN-bus protocol for an ever growing array of different applications has resulted in increased demand for data bandwidth. A new CAN protocol, CAN with Flexible Data-Rate (CAN FD), is designed to provide data bandwidth that is 1 MBit/s or higher and with payloads longer than 8 bytes per frame. The CAN FD protocol is designed to use the same the physical layer as the older CAN protocol (e.g., the BOSCH CAN Specification 2.0).

Aspects of the present disclosure are based upon the recognition that the common physical layer between different versions of a (e.g., CAN-bus) protocol can present difficulties in achieving the increased data bandwidth for a new version of the protocol (e.g., CAN FD). These and other matters have presented challenges to data bus communication protocols, for a variety of applications.

Various example embodiments are directed to an enhanced driver mode for a shared bus, and to related circuits and their implementation.

According to an example embodiment, a device includes a transmission circuit that is configured and arranged to transmit data in accordance with a signal bus protocol that uses passive bias to set a signal bus to a recessive value in the absence of an actively-driven signal value. The transmission circuit includes a first driver circuit that is configured and arranged to actively drive the signal bus to a dominant value that is different from the recessive value. The transmission circuit also includes a second driver circuit that is configured and arranged to actively drive the signal bus to the recessive value. A control circuit is configured and arranged to disable the second driver circuit in response to the device operating in a first data transmission mode, and to enable the second driver circuit in response to the device entering a second transmission mode.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
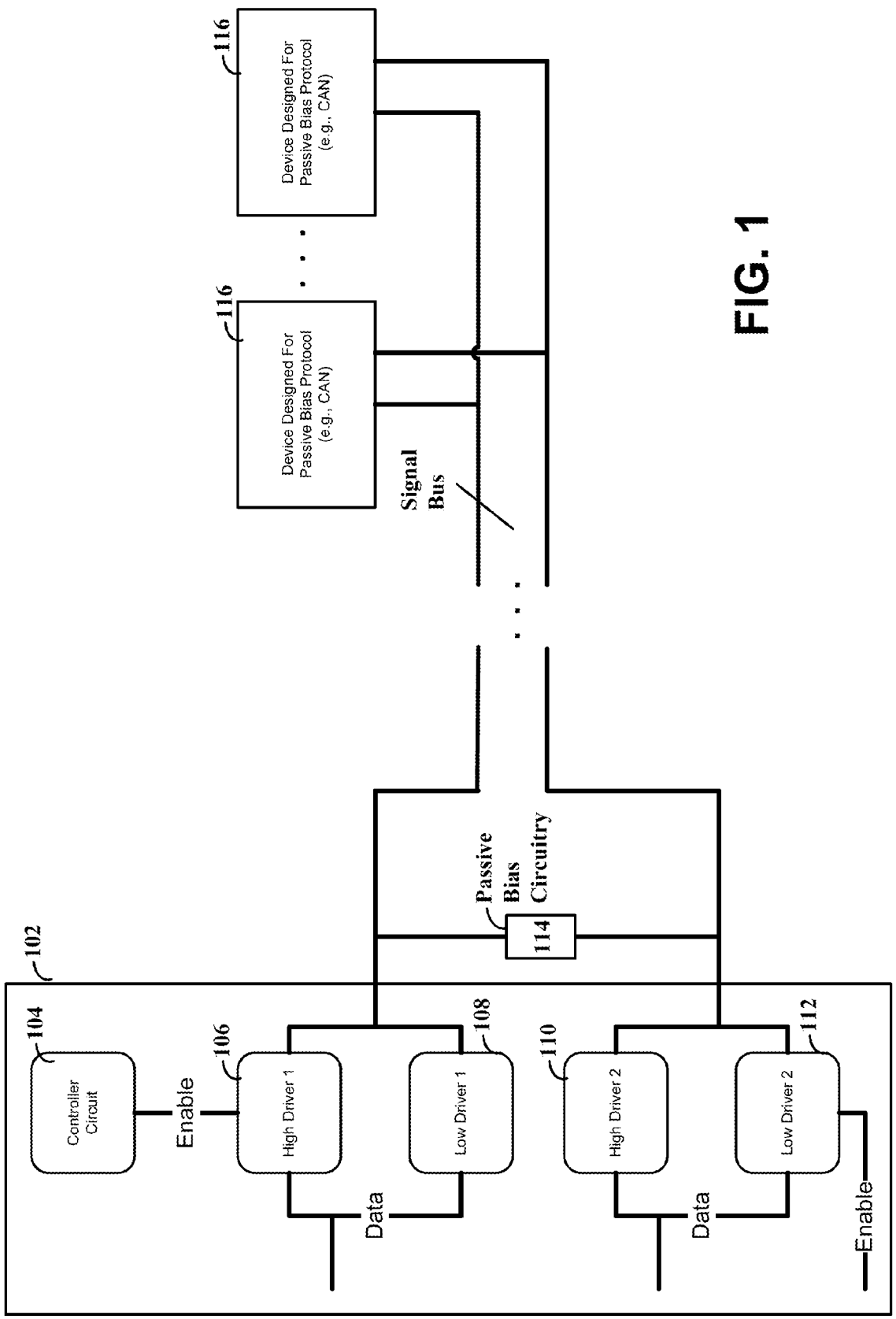
FIG. 1 depicts a block diagram of a system including a device configured to actively drive a bus with a passive bias, consistent with embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure, including aspects defined in the claims. In addition, the term "example" as used throughout this application is only by way of illustration, and not limitation.

Aspects of the present disclosure are believed to be applicable to a variety of different types of apparatuses, systems and methods involving devices and methods useful in the context of driving a bus during an enhanced mode. While not necessarily so limited, various aspects may be appreciated through a discussion of examples using this context.

Various example embodiments are directed to bus protocols that transmit data using one of two complementary logical values: dominant or recessive. The recessive level can be provided using passive bias (e.g., resistive termination), with a resistor. The dominant level can be actively driven by a circuit, such as using transistor(s) that are activated to drive the bus to the dominant level. Accordingly, if any device on the bus drives to the dominant level, the resulting bus value will be dominant. For example, in case of a wired-AND implementation of the bus, the dominant level would be represented by a logical '0' and the recessive level by a logical '1'.

Embodiments of the present disclosure are directed toward a method or device that actively drives a bus to signal levels consistent with both the dominant and recessive levels, while maintaining compatibility with devices that are configured to communicate using the passive bias. For instance, the other devices can be configured to communicate according to a bus protocol that does not contemplate other devices that actively drive the bus to the recessive levels. In certain embodiments, the process of actively driving the bus to the recessive level occurs in response to the device entering an enhanced data transmission mode, which provides increased data bandwidth.

Various aspects of the present disclosure are directed toward a first device that is configured to detect when another device is driving the bus toward the dominant level at the same time that the first device is driving the bus to the recessive level. For instance, the first device can be configured to detect a threshold level for the bus that is consistent with two driver circuits actively driving in different directions.

More particular embodiments are directed toward systems, devices or methods for use with the CAN FD-bus protocol. The CAN FD-bus protocol can use the same physical layer as the predecessor CAN bus protocol. Higher layers, however, can be different. For instance, the frame format is different. The CAN FD frame format includes two new control bits. The first control bit makes use of the (first) reserved bit of a CAN frame to indicate whether or not the communication is using the new frame format. Another control bit indicates whether or not the communication is using an enhanced mode with a faster bit rate. The CAN FD frame format is configured so that messages in CAN frame format and in CAN FD frame format can coexist within the same network.

The physical layer of an ideal CAN network uses a bus topology having two termination resistors (2×120 ohm) at each end of the CAN bus, but in practice different, less ideal topologies are chosen with long stubs connected to the bus (passive star). This non ideal topology can limit the maximum speeds during arbitration, caused by the non ideal termination, resulting in reflections on the bus. These non-idealities limit the theoretical bandwidth of the bus and are at least part of the reason that actual the bus speed has remained below 1 Mb/s (~500 kB/s in passenger's cars, ~100 kB/s in trucks). Because the arbitration speed was the previous limiting factor, the CANFD protocol allows the arbitration speed to be decoupled from the data phase speed to increase the total bandwidth.

More particularly, an ideal CAN network would act as a perfect transmission line having two termination resistors, one at each end of the cable, and a perfect characteristic impedance of 120 Ω over the entire relevant frequency range. In practice, however, multiple nodes are connected via stubs to the main cable which are too long and will result in a departure from the ideal impedance. Also the termination resistors, together with transceiver input capacitance and cable capacitance can create an RC time-constant discharge when an actively-driven dominant bit on the bus transitions to an un-driven recessive bit.

Aspects of the present disclosure relate to the recognition that backwards compatibility with the CAN frame format creates issues relating to the use of the new CAN FD protocol. For instance, the higher speed during the data phase can result in more emission (EME) and a reduced immunity to RF disturbance (EMI). There can also be difficulties of non-ideal terminated CAN topology. Aspects of the present disclosure are therefore related to a dedicated CANFD transceiver which changes the mode of operation during transmission of the data field, and thereby helps to improve the EMC and data bandwidth (particularly on non-ideal CAN network topologies).

Consistent with various embodiments of the present disclosure, it is recognized that the output stage of the CAN transmitter has a finite common mode rejection caused by a mismatch in impedance (parasitic capacitance of the components) between CANH and CANL during large common mode voltage swings (>5V).

While the cut-off frequency of a differential low pass filter present in the receiver path can help to prevent EMI problems with CAN communication speeds below 1 Mb/s, once the communication speed is increased (e.g., during the data phase of CANFD), the cut-off frequency of the low pass receiver filter also needs to be increased. This increase, however, can result in an EMI problem in the mid-band frequencies.

Accordingly, aspects of the present disclosure are directed toward the bus being driven symmetrical during the high speed data phase (using active driver circuits in both directions). This can be accomplished using two similar output stages in a bridge configuration. This results in the cancelation of the even order harmonics of a single output stage and an improvement in common mode emission (relative to a combination of actively and passively driven signals). Moreover, because the transition from dominant to recessive is actively driven in a manner that is similar to the recessive to dominant transition, the ringing of a transition from dominant to recessive (caused by non-idealities in the network) can be reduced. These and other factors can be particularly useful for achieving a higher bus speed/data bandwidth.

Turning now to the figures, FIG. 1 depicts a block diagram of a system including a device configured to actively drive a bus with a passive bias, consistent with embodiments of the present disclosure. Device 102 is configured to communicate with devices 116 using a shared signal bus. In specific embodiments, the shared signal bus can be implemented using a differential signal path; however, other solutions are possible, such as a single-ended signal path. The system includes elements 114 that provide a passive bias to the bus.

Device 102 can be configured to transmit data to devices 116 by driving the signal bus to the appropriate signal level(s). This can be accomplished using signal driver circuits 106-112, which are responsive to data input signals.

Device 102 can include a controller circuit 104, which can be implemented using programmable logic, specially-configured microprocessor circuit(s) and/or discrete circuit components. Controller circuit 104 can be configured and arranged to generate an enable signal in response to the device entering a particular data transmission mode. When the enable signal is not present (inactive level), the corresponding driver circuits 106, 112 are not enabled. In this mode, the passive bias on the signal bus is used to set the bus to the recessive signal level. When the enable signal is present (active level), the corresponding driver circuits 106, 112 are enabled. In this mode, the signal bus is actively driven by the driver circuits. Control circuit 104 can therefore be configured to enable driver circuits 106, 112 when the device 102 is transmitting in an enhanced mode (e.g., consistent with an increased data rate of CAN FD).

Figure 2:
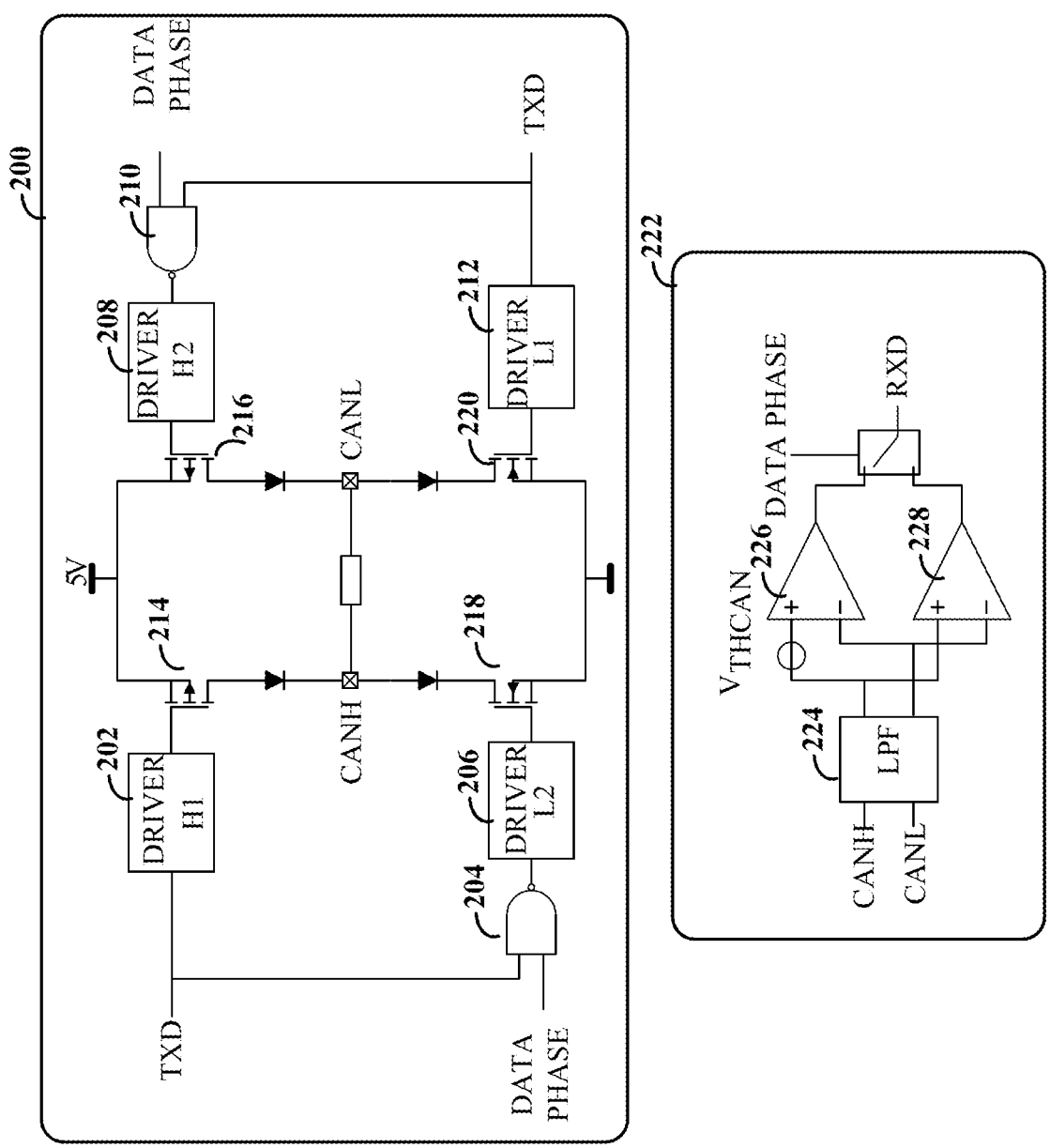
FIG. 2 depicts a circuit diagram of a transmission circuit, consistent with embodiments of the present disclosure.

FIG. 2 depicts a circuit diagram of a transmission circuit, consistent with embodiments of the present disclosure. Transmission circuit 200 includes driver circuits 202 and 208, which are configured and arranged to actively drive a respective bus line high, using field effect transistors (FETs) 214 and 216. Driver circuits 206 and 212 are configured and arranged to actively drive a respective bus line low, using FETs 218 and 220. Enable circuitry 204 and 210 controls whether or not FETs 216 and 218 are enabled. When these FETs are not enabled, the passive bias on the bus controls/drives the voltage level. When these FETs are enabled, the bus is actively driven using FETs 216 and 218.

The enable signal (DATA PHASE) can be generated in response to the device entering a particular data transmission mode. For instance, the enable signal can be generated in response to the device entering a data phase that uses the (optional) high data rate of the CAN FD protocol.

Circuit 222 shows an example receiver circuit for use in connection with the transmission circuit 200. A low pass filter 224 can be used to remove high frequency components. Two different receiver circuits 226, 228 can be used to detect the presence of incoming data. This can help to improve symmetry between level transitions on the signal bus and the generation of the corresponding internal receive (RXD) signal. Accordingly, the threshold levels for each receiver can be set to different values, as discussed in more detail herein.

Figure 3:
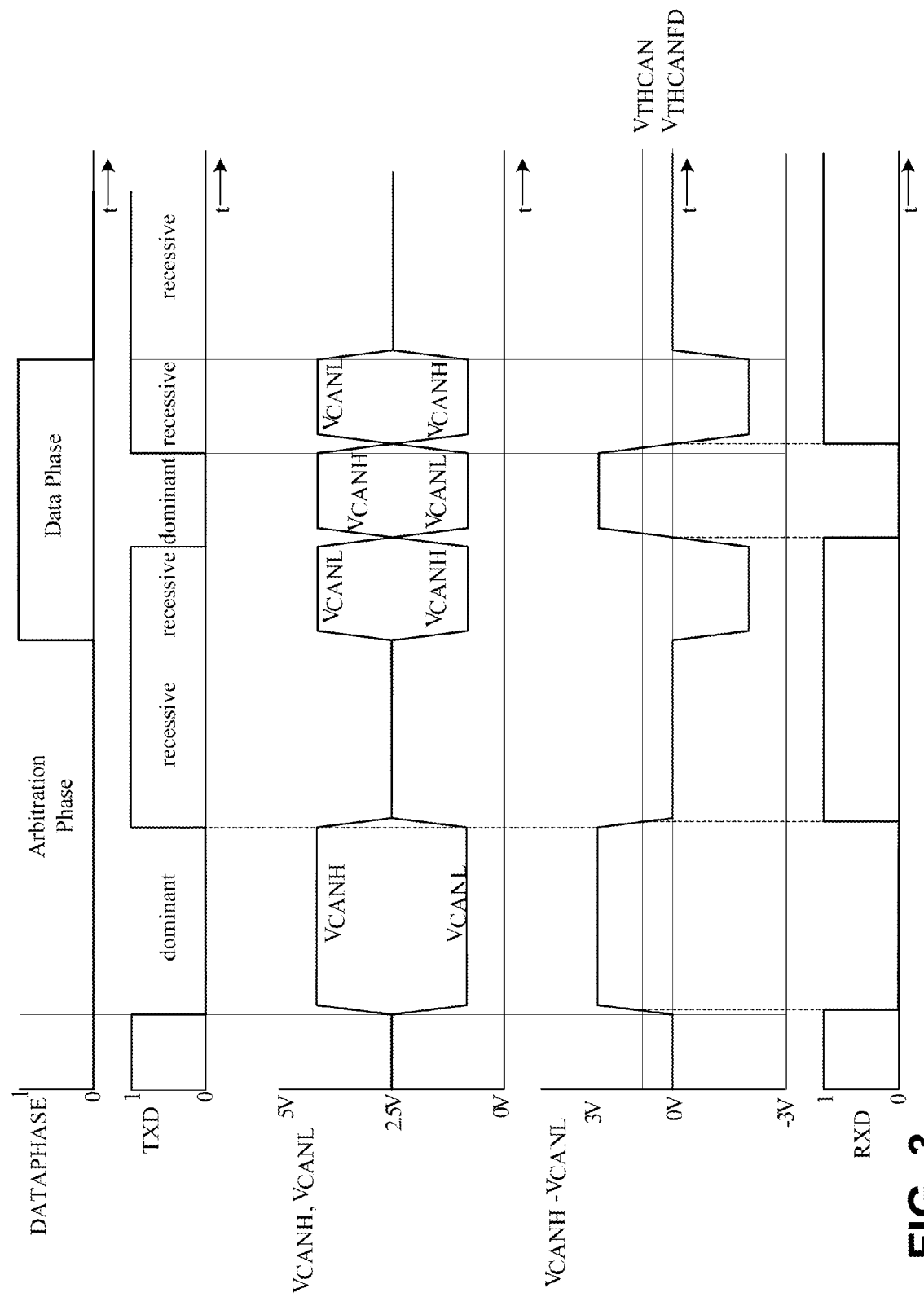
FIG. 3 shows a signal timing diagram for signals that are used in connection with a CAN FD protocol, consistent with embodiments of the present disclosure.

FIG. 3 shows a signal timing diagram for signals that are used in connection with a CAN FD protocol, consistent with embodiments of the present disclosure. The CAN FD protocol allows the arbitration phase to proceed at a different (relatively slow) data rate from a subsequent data phase. During the arbitration phase, the DATAPHASE signal is low, and only DRIVERH1 202 and DRIVERL1 212 circuits are active. Thus, transmission circuit 200 uses the passive bias to drive the signal bus to a recessive level (consistent with the CAN bus protocol). Also, the standard CAN receiver threshold is selected to generate the RXD signal. During arbitration phase any node on the bus is allowed to drive the bus dominant to determine which wins the arbitration. This is possible because of the open-drain nature of the output stages.

At the beginning of the high speed data phase the DATAPHASE signal becomes high, and the DRIVERH2 208 and DRIVERL2 206 circuits can begin actively driving the signal bus. The transmission circuit 200 thereby drives both the dominant as well the recessive levels, in a balanced manner. The CAN FD protocol limits transmission during the data phase to the sending node, and thereby facilitates active driving to the recessive level.

The CANFD receiver can be set with its signal detection threshold at 0V, which is used to generate an internal receive (RXD) signal. A threshold at 0V can be particularly useful for providing a symmetrical RXD delay between active high and low signals. This symmetry can be a particularly relevant parameter at high data transmission speeds, such as where the transition time between dominant and recessive is a significant part of the bit time. Other non-CAN FD transceivers nodes on the bus with the default receiver levels at 0.7V are still able to detect correct dominant and recessive levels but don't have a symmetrical bus to RXD delay, which can become a limiting factor in the maximum obtainable speed.

Figure 4:
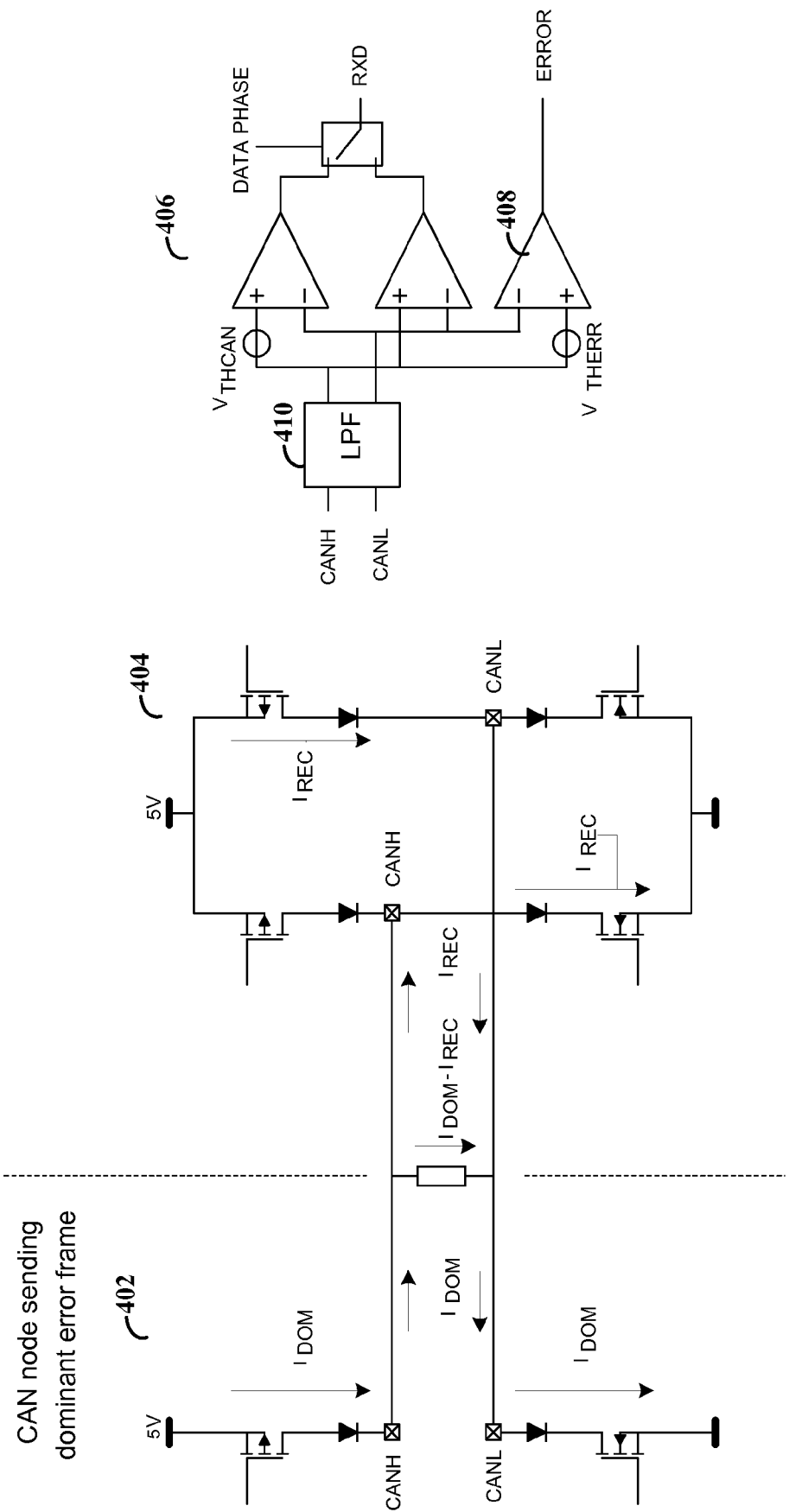
FIG. 4 depicts a system for detecting an error condition while transmitting in an enhanced data mode, consistent with embodiments of the present disclosure.

FIG. 4 depicts a system for detecting an error condition while transmitting in an enhanced data mode, consistent with embodiments of the present disclosure. Certain embodiments of the present disclosure are directed toward the detection transmission of an error frame by a device 402. Consistent with the CAN protocol, the error frame can be transmitted by driving the signal bus to a dominant level. The CAN FD protocol presumes that when the currently transmitting device 404 outputs a recessive value, the device 402 will maintain the signal bus at the dominant level. The transmitting device 404 would then use its receiver circuit 406 to detect when the signal bus does not reach the recessive level (because device 402 is driving the signal bus). It has been recognized, however, that when transmitting device 404 is actively driving the signal bus to the recessive level, the drive currents of both devices oppose one another. Accordingly, the transmitting device 404 can include a receiver circuit 408 with a threshold level set to detect such a situation.

Figure 5:
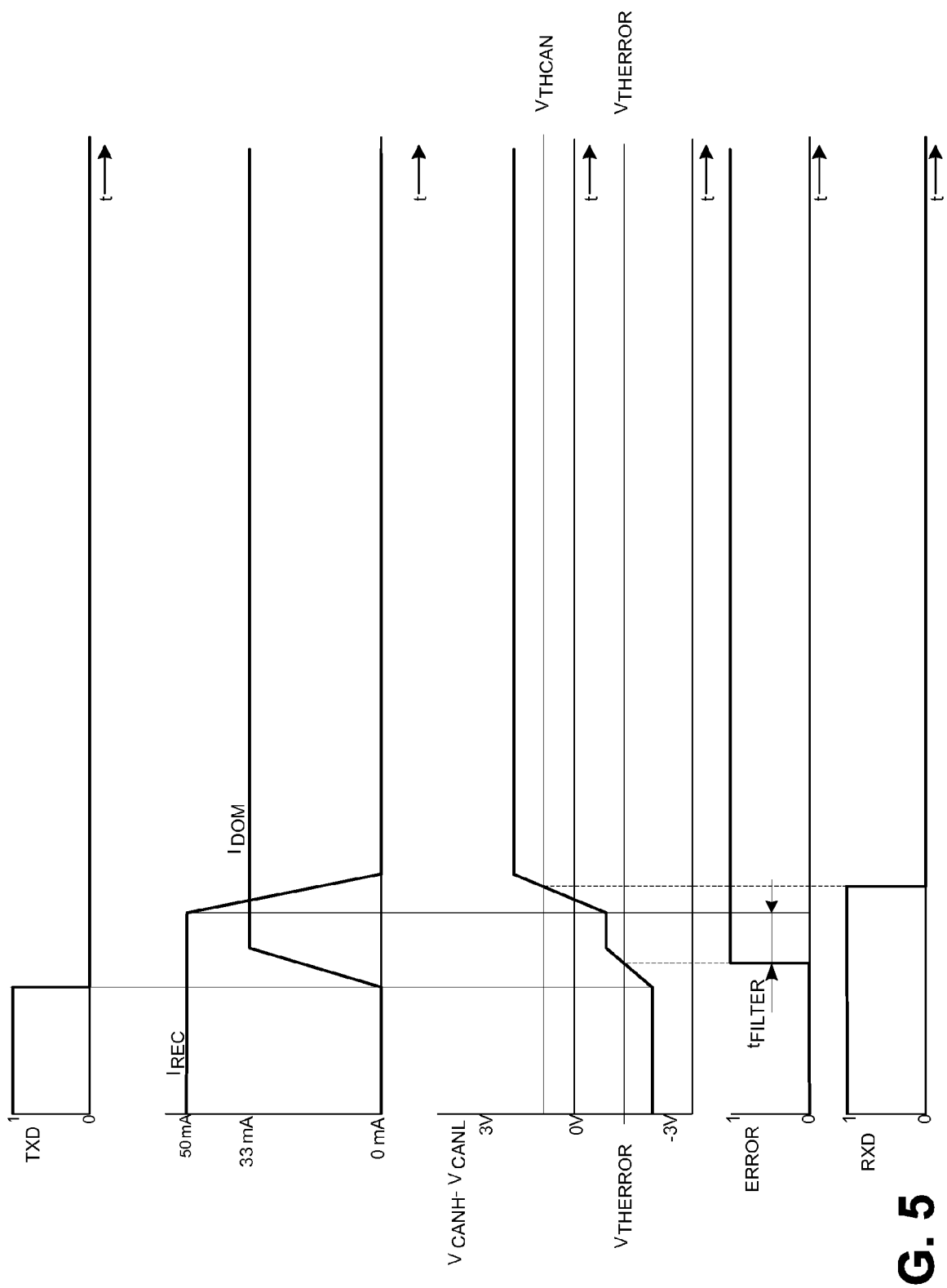
FIG. 5 depicts a signal timing diagram for signals that are used in connection with devices that are configured to simultaneously drive the signal bus in opposing directions, consistent with embodiments of the present disclosure.

FIG. 5 depicts a signal timing diagram for signals that are used in connection with devices that are configured to simultaneously drive the signal bus in opposing directions, consistent with embodiments of the present disclosure. As discussed in connection with FIG. 4, a threshold level can be used to detect when another device 402 is attempting to actively drive the bus toward the dominant level at the same time that the transmitting device 404 is actively driving the signal bus to a recessive level. The threshold detection level ($V_{THERROR}$) can be set to account for the scenario where the dominant current is at its minimum while the recessive current is at its maximum. As a non limiting example, the minimum current for CAN transceivers can be determined by dividing the minimum dominant differential voltage of 1.5V by the worst case bus load of 45 ohm. This results in a current of 33 mA. The maximum current of a CAN FD transceiver can be limited to 50 mA. For a (worst case) bus load of 65 ohm, the resulting differential voltage is Vdiff=−1V. An additional receiver comparator with a threshold/trip level ($V_{THERROR}$) between −1V and −1.5V can therefore be used to detect when another transmitter is sending an active error frame on the bus. Device 404 can be configured to respond to the detection by preventing active driving toward the recessive value.

In certain embodiments, the disabling action can be delayed. This delay can be accomplished using, as a non-limiting example, a low pass filter 410 that filters out short voltage spikes, which could be caused by noise. The (filter) delay time can be particularly useful for avoiding inadvertent triggering due to noise on the bus. The other node will then be able to drive the signal bus to a dominant level. Increasing the delay time (e.g., using a filter operating at a lower cutoff frequency), can help to reduce the amount of false detection events. The maximum delay time, however, can be set low enough to guarantee that the delay does not conflict with the particular protocol and/or system design. For a CAN FD protocol, the delay can be set to less than about 225 ns, which represents the maximum expected loop delay time between the TXD and RXD of the transceiver sending the active error frame.

Figure 6:
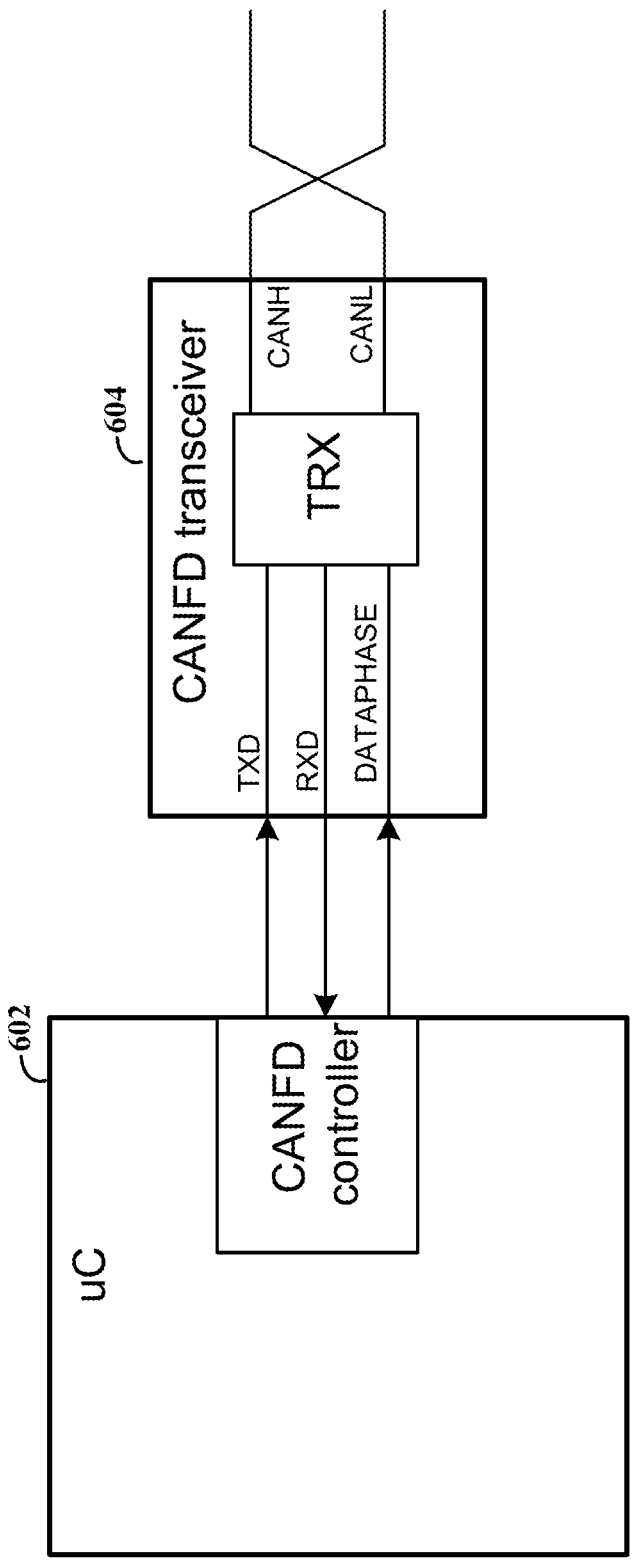
FIG. 6 depicts a system where a controller circuit provides an indication of implementing an enhanced data transmission mode, consistent with embodiments of the present disclosure.

FIG. 6 depicts a system where a controller circuit provides an indication of implementing an enhanced data transmission mode, consistent with embodiments of the present disclosure. In certain embodiments, a system can be designed with a transmitter circuit 604 that is controlled by a (CAN FD) controller circuit/module 602. As shown in FIG. 6, the DATAPHASE signal can be generated directly from the controller circuit 602. Transmitter circuit 604 receives this signal and, in response, enables/disables active driving of the signal bus to the recessive level. This solution relies upon both the controller circuit 602 and the transmitter circuit 604 being configured with an additional dedicated pin or other communication link.

Figure 7:
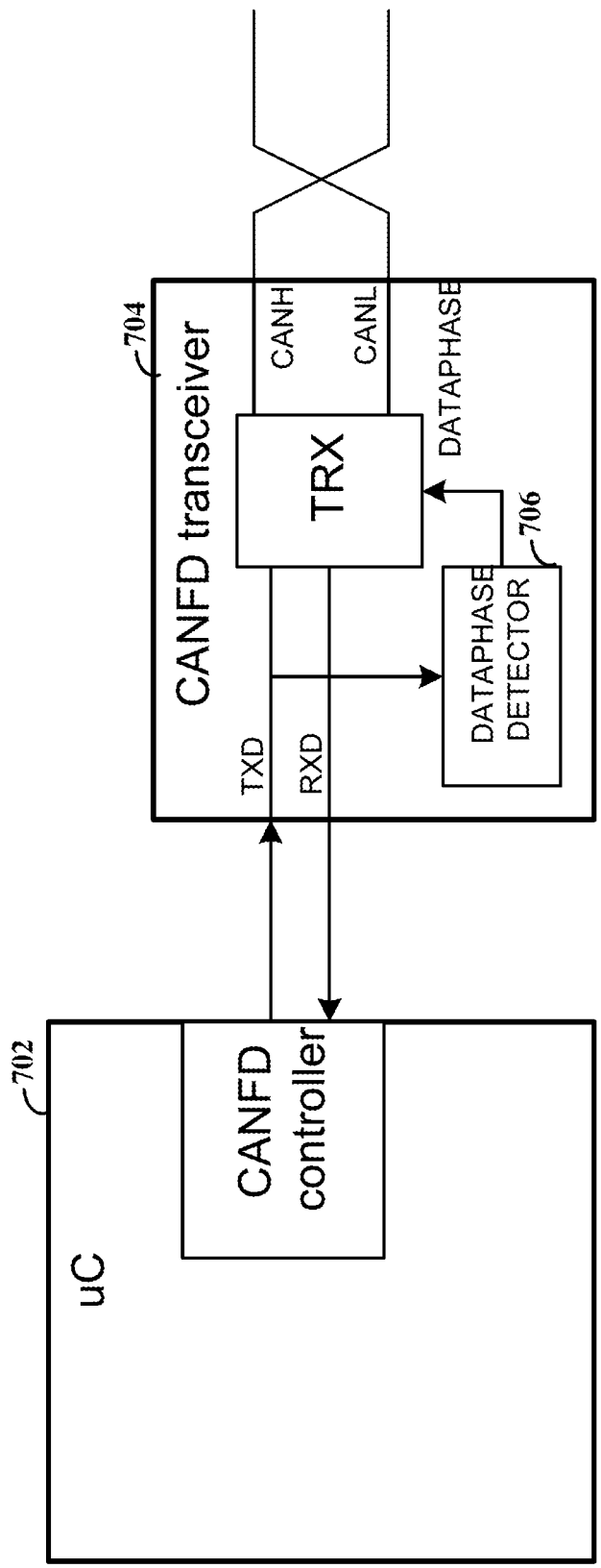
FIG. 7 depicts a system where a transmitter circuit detects an enhanced data transmission mode based upon the received data, consistent with embodiments of the present disclosure.

FIG. 7 depicts a system where a transmitter circuit detects an enhanced data transmission mode based upon the received data, consistent with embodiments of the present disclosure. The transmitter circuit 704 is designed to be controlled by a (CAN FD) controller circuit/module 702. The system is designed such that controller circuit 702 does not transmit a control (DATAPHASE) signal to indicate when transmitter circuit 704 should enable/disable active driving of the signal bus to the recessive level. Transmitter circuit 704 can include a detection module (DATAPHASE DETECTOR) 706 that is configured and arranged to ascertain the start and end of the enhanced data transmission mode from the data (TXD) signal received from controller circuit 702. For instance, the detection module 706 can detect the presence or absence of additional control bits in the frame, as defined by the CAN FD protocol. This can include monitoring for the (first) reserved bit of a CAN frame, which indicates whether or not the communication is using the new frame format and for the (second) control bit that indicates whether or not the communication is using an enhanced mode with a faster bit rate. In response to the monitored data signals, the detection module 706 can then generate a control (DATAPHASE) signal that is used to enable/disable active driving of the signal bus to the recessive level. This solution can be particularly useful for systems that use a controller circuit 702 that does not include additional control circuitry and/or use an additional control/output pin.

Figure 8:
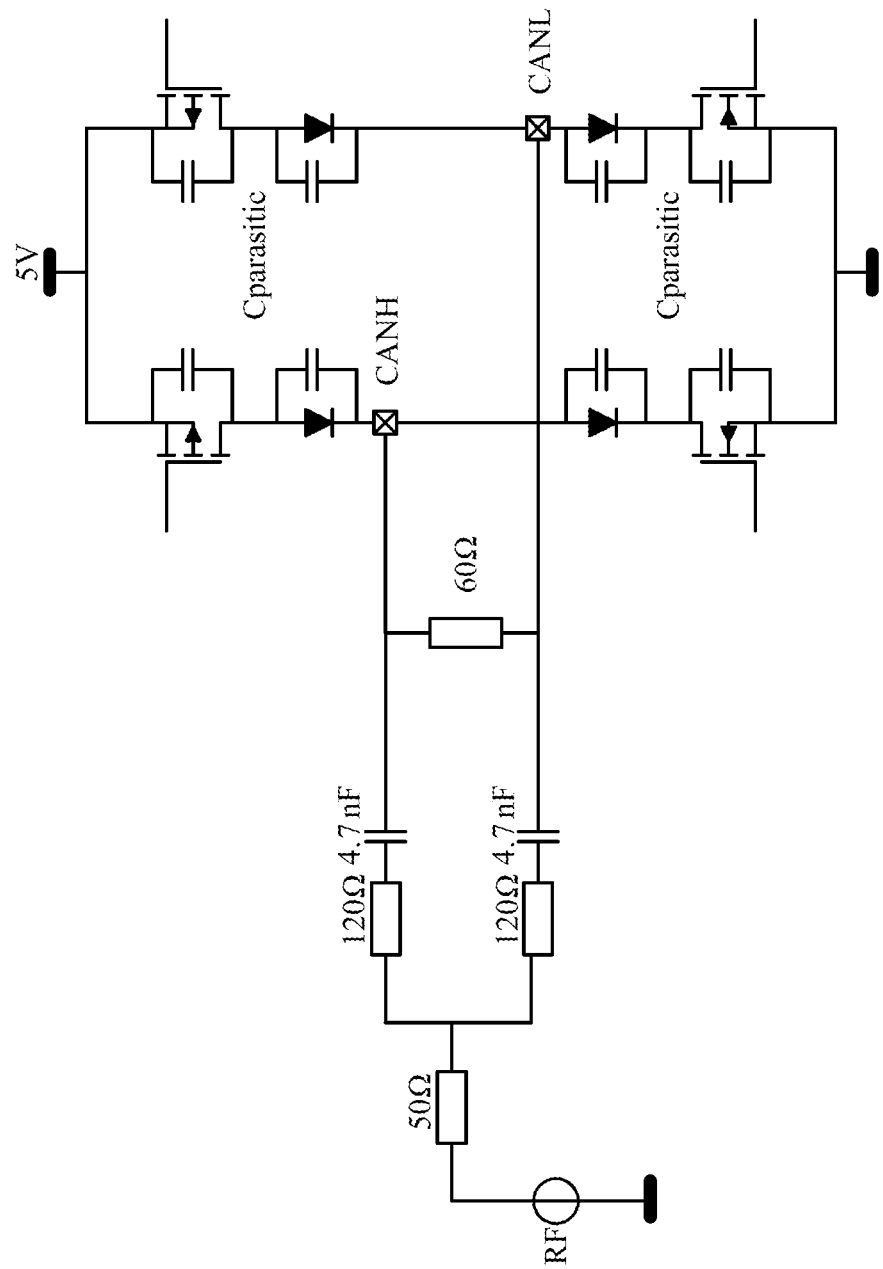
FIG. 8 depicts the effective impedance seen on a differential signal bus for a transmitter circuit, consistent with embodiments of the present disclosure.

FIG. 8 depicts the effective impedance seen on a differential signal bus for a transmitter circuit, consistent with embodiments of the present disclosure. As shown in FIG. 8, the impedance of CANH and CANL can be effectively matched for the whole common mode voltage range, resulting in a much better common mode rejection and thus in a better EMI performance. This is due, in part, to the presence of active driver circuits on each of the signal lines. Accordingly, the corresponding parasitic capacitances are balanced between the signal lines.

The particular component values and circuit configuration shown in the various figures (including those of FIG. 8) are non-limiting examples, which are generally consistent with a CAN FD system. The present disclosure is not limited thereto and the values can be modified according to the particular system and/or protocol.

Unless otherwise stated, the various embodiments discussed herein can be used together in a variety of different combinations. Each and every possible combination is not necessarily expressly recited. Various modules and/or other circuit-based building blocks may be implemented to carry out one or more of the operations and activities described herein and/or shown in the figures. In such contexts, a "module" or "block" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in the figures. In certain embodiments (e.g., to provide the control logic), the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a processor hardware-based circuit and a set of instructions in the form of firmware, in which the first module includes a first processor hardware circuit with one set of instructions and the second module includes a second processor hardware circuit with another set of instructions.

Based upon the above discussion and illustrations, those skilled in the art will readily recognize that various modifications and changes may be made to the various embodiments without strictly following the exemplary embodiments and applications illustrated and described herein. For example, the systems, devices and methods can be used in connection with standards and protocols other than CAN or CAN FD. Such modifications do not depart from the true spirit and scope of various aspects of the invention, including aspects set forth in the claims.

What is claimed is:

1. A device comprising:
a transmission circuit configured and arranged to transmit data in accordance with a signal bus protocol that uses passive bias to set a signal bus to a recessive value in the absence of an actively-driven signal value and including a first driver circuit configured and arranged to actively drive the signal bus to a dominant value that is different from and higher than the recessive value, and
a second driver circuit configured and arranged to actively drive the signal bus to and through the recessive value to another value that is below the recessive value; and
a control circuit configured and arranged to
disable the second driver circuit in response to the device operating in a first data transmission mode, and
enable the second driver circuit in response to the device entering a second transmission mode.

2. The device of claim 1, wherein the first data transmission mode corresponds to an arbitration mode for a controller area network (CAN) protocol and wherein the device is configured and arranged to perform bus arbitration by monitoring the signal bus to detect that another device has driven a dominant value on the signal bus.

3. The device of claim 1, wherein the second transmission mode corresponds to a high speed mode for a controller area network (CAN) protocol and wherein the device is configured and arranged to actively drive the signal bus to both the recessive value and the dominant value.

4. The device of claim 1, wherein the first and second driver circuits are configured and arranged to drive a first signal line of a differential signal path that is part of the signal bus and shared between multiple devices and wherein the transmission circuit further includes third and fourth driver circuits for driving a second signal line of the differential signal path.

5. The device of claim 1, wherein the control circuit is further configured and arranged to detect when another device actively drives the signal bus toward the dominant value at the same time that the second driver circuit is actively driving the signal bus to the recessive value.

6. The device of claim 5, wherein the control circuit includes a threshold voltage detection circuit configured and arranged to detect when another device actively drives the signal bus toward the dominant value at the same time that the second driver circuit is actively driving the signal bus to the recessive value.

7. The device of claim 1, wherein the second driver circuit is further configured and arranged to suppress ringing that results from a transition from the dominant value to the recessive value by actively driving toward the recessive value.

8. A method of operating a device having a transmission circuit that includes first and second driver circuits, the method comprising:
transmitting, using a transmission circuit, data in accordance with a signal bus protocol that uses passive bias to set a signal bus to a recessive value in the absence of an actively-driven signal value, by
actively driving, using a first driver circuit, the signal bus to a dominant value that is different from and higher than the recessive value, and
actively driving, using a second driver circuit, the signal bus to and through the recessive value to another value that is lower than the recessive value; and
disabling the second driver circuit in response to the device operating in a first data transmission mode, and
enabling the second driver circuit in response to the device entering a second transmission mode.

9. The method of claim 8, wherein the first data transmission mode corresponds to an arbitration mode for a controller area network (CAN) protocol and further including a step of performing bus arbitration by monitoring the signal bus to detect that another device has driven a dominant value on the signal bus.

10. The method of claim 8, wherein the second transmission mode corresponds to a high speed mode for a controller area network (CAN) protocol and further including steps of actively driving the signal bus to both the recessive value and the dominant value.

11. The method of claim 8, further including driving the signal bus by driving a first signal line and second signal line of a differential signal path that is shared between multiple devices.

12. The method of claim 8, further including detecting when another device actively drives the signal bus toward the dominant value at the same time that the second driver circuit is actively driving the signal bus to the recessive value.

13. The method of claim 12, wherein the step of detecting includes using a threshold voltage detection circuit to detect a value on the signal bus that corresponds to two devices simultaneously driving the signal bus in opposing directions.

14. The method of claim 8, further including suppressing, using the second driver circuit, ringing that results from a transition from the dominant value to the recessive value by actively driving toward the recessive value.

* * * * *